US007482037B2

(12) United States Patent
Derderian et al.

(10) Patent No.: US 7,482,037 B2
(45) Date of Patent: Jan. 27, 2009

(54) METHODS FOR FORMING NIOBIUM AND/OR VANADIUM CONTAINING LAYERS USING ATOMIC LAYER DEPOSITION

(75) Inventors: Garo J. Derderian, Boise, ID (US); Donald L. Westmoreland, Boise, ID (US); Stefan Uhlenbrock, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 935 days.

(21) Appl. No.: 10/923,315

(22) Filed: Aug. 20, 2004

(65) Prior Publication Data

US 2006/0040480 A1 Feb. 23, 2006
US 2007/0148932 A9 Jun. 28, 2007

(51) Int. Cl.
*C23C 16/40* (2006.01)
(52) U.S. Cl. ............... 427/255.31; 427/255.32; 117/84; 117/88
(58) Field of Classification Search ............ 427/255.31, 427/255.32; 117/84, 88
See application file for complete search history.

(56) References Cited

U.S. PATENT DOCUMENTS

| 5,344,948 A * | 9/1994 | Verkade .................... 556/51 |
| 6,545,791 B1 * | 4/2003 | McCaughan et al. ........ 359/245 |
| 6,632,279 B1 | 10/2003 | Ritala et al. |
| 2001/0024387 A1 | 9/2001 | Raaijmakers et al. |
| 2002/0142588 A1 | 10/2002 | Basceri et al. |
| 2002/0192509 A1 | 12/2002 | Basceri et al. |
| 2003/0033984 A1 | 2/2003 | Carpenter et al. |
| 2004/0009679 A1 | 1/2004 | Yeo et al. |
| 2004/0235285 A1 * | 11/2004 | Kang et al. ................. 438/597 |

FOREIGN PATENT DOCUMENTS

WO   WO2002075444   *   2/2002

OTHER PUBLICATIONS

Hawley, G.G., "The Condensed Chemical Dictionary," 1981, 10th Edition, Van Nostrand Reinhold Co., New York, 225.
*Inorgtech Epichem*, Catalog Sheet listing Product Codes 013-015; available on or before Dec. 20, 2002: p. 7.
Vehkamaki et al., "Growth of $SrTiO_3$ and $BaTiO_3$ Thin Films by Atomic Layer Deposition," *Electrochemical and Solid-State Letters*, Oct. 1999;2(10):504-506.

* cited by examiner

*Primary Examiner*—Bret Chen
(74) *Attorney, Agent, or Firm*—Mueting, Raasch & Gebhardt, P.A.

(57) ABSTRACT

A method of forming a metal containing layer on a substrate, particularly a semiconductor substrate or substrate assembly for use in manufacturing a semiconductor or memory device structure, using one or more precursor compounds that include niobium and/or vanadium and using an atomic layer deposition process including a plurality of deposition cycles.

85 Claims, 2 Drawing Sheets

US 7,482,037 B2

METHODS FOR FORMING NIOBIUM AND/OR VANADIUM CONTAINING LAYERS USING ATOMIC LAYER DEPOSITION

FIELD OF THE INVENTION

This invention relates to methods of forming a metal containing layer, such as a metal oxide layer, on a substrate using one or more precursor compounds using a vapor deposition process. The precursor compounds and methods are particularly suitable for the formation of metal containing layers on semiconductor substrates or substrate assemblies.

BACKGROUND OF THE INVENTION

In integrated circuit manufacturing, microelectronic devices such as capacitors are the basic energy storage devices in random access memory devices, such as dynamic random access memory (DRAM) devices, static random access memory (SRAM) devices, and ferroelectric memory (FERAM) devices. Capacitors typically consist of two conductors, such as parallel metal or polysilicon plates, which act as the electrodes (i.e., the storage node electrode and the cell plate capacitor electrode), insulated from each other by a layer of dielectric material.

The continuous shrinkage of microelectronic devices such as capacitors and gates over the years has led to a situation where the materials traditionally used in integrated circuit technology are approaching their performance limits. Silicon (i.e., doped polysilicon) has generally been the substrate of choice, and silicon dioxide ($SiO_2$) has frequently been used as the dielectric material with silicon to construct microelectronic devices. However, when the $SiO_2$ layer is thinned to 1 nanometer (nm) (i.e., a thickness of only 4 or 5 molecules), as is desired in the newest micro devices, the layer no longer effectively performs as an insulator due to the tunneling current running through it.

Thus, new high dielectric constant materials are needed to extend device performance. Such materials need to demonstrate high permittivity, barrier height to prevent tunneling, stability in direct contact with silicon, and good interface quality and film morphology. Furthermore, such materials must be compatible with the gate material, electrodes, semiconductor processing temperatures, and operating conditions.

High quality thin oxide films of metals, such as $ZrO_2$, $Ta_2O_5$, $HfO_2$, $Al_2O_3$, $Nb_2O_5$, and YSZ deposited on semiconductor wafers have recently gained interest for use in memories (e.g., dynamic random access memory (DRAM) devices, static random access memory (SRAM) devices, and ferroelectric memory (FERAM) devices). These materials have high dielectric constants and therefore are attractive as replacements in memories for $SiO_2$ where very thin layers are required. These metal oxide layers are thermodynamically stable in the presence of silicon, minimizing silicon oxidation upon thermal annealing, and appear to be compatible with metal gate electrodes. Additionally, $Nb_2O_5$, $Nb_2O_5$ doped/laminated $Al_2O_3$, $Ta_2O_5$, and $HfO_2$ films have been shown to be useful for capacitor and gate dielectrics. $Nb_2O_5$ doping/laminating has been shown to decrease leakage and stabilize crystalline phases.

Efforts have been made to investigate various deposition processes to form layers, especially dielectric layers, based on metal oxides. Such deposition processes have included vapor deposition, metal thermal oxidation, and high vacuum sputtering. Vapor deposition processes, which includes chemical vapor deposition (CVD) and atomic layer deposition (ALD), are very appealing as they provide for excellent control of dielectric uniformity and thickness on a substrate.

SUMMARY OF THE INVENTION

In view of the foregoing, and despite improvements in semiconductor dielectric layers, there remains a need in the semiconductor art for a vapor deposition process utilizing sufficiently volatile metal precursor compounds that can form a thin, high quality oxide layer, particularly on a semiconductor substrate. Accordingly, the present invention is directed to methods of manufacturing a semiconductor structure including at least one precursor compound including a metal selected from the group of niobium and vanadium, to methods of forming a niobium oxide layer on a substrate, and to an atomic layer vapor deposition apparatus that includes at least one precursor compound including a metal selected from the group of niobium and vanadium.

In one aspect, the present invention is directed to a method of manufacturing a semiconductor structure, the method including: providing a semiconductor substrate or substrate assembly; providing a vapor including at least one precursor compound of the formula $M(OR^1)_{5-x}(XR^2O)_x$ (Formula I), wherein M is selected from the group consisting of niobium and vanadium, X is $(NR^3R^4)$, $(PR^3R^4)$, or $(OR^5)$, each $R^1$, $R^2$, $R^3$, $R^4$, and $R^5$ is independently an organic group, x=1 or 2; and contacting the vapor including the at least one precursor compound of Formula I with the semiconductor substrate or substrate assembly to form a metal-containing layer on at least one surface of the semiconductor substrate or substrate assembly using an atomic layer deposition process including a plurality of deposition cycles.

The present invention may also include the use of a reaction gas in methods for the manufacture of a semiconductor structure. Thus, in a further aspect, the present invention is also directed to a method of manufacturing a semiconductor structure, the method including: providing a semiconductor substrate or substrate assembly; providing a vapor including at least one precursor compound of the formula $M(OR^1)_{5-x}(XR^2O)_x$ (Formula I), wherein M is selected from the group consisting of niobium and vanadium, X is $(NR^3R^4)$, $(PR^3R^4)$, or $(OR^5)$, each $R^1$, $R^2$, $R^3$, $R^4$, and $R^5$ is independently an organic group, x=1 or 2; providing at least one reaction gas; and contacting the vapor including the at least one precursor compound of Formula I with the semiconductor substrate or substrate assembly to form a metal-containing layer on at least one surface of the semiconductor substrate or substrate assembly using an atomic layer deposition process including a plurality of deposition cycles.

In yet another aspect, the present invention is directed to a method of manufacturing a semiconductor structure, the method including: providing a semiconductor substrate or substrate assembly within a deposition chamber; providing a vapor including at least one precursor compound of the formula $M(OR^1)_{5-x}(XR^2O)_x$ (Formula I), wherein M is selected from the group consisting of niobium and vanadium, X is $(NR^3R^4)$, $(PR^3R^4)$, or $(OR^5)$, each $R^1$, $R^2$, $R^3$, $R^4$, and $R^5$ is independently an organic group, x=1 or 2; directing the vapor including the at least one precursor compound of Formula I to the semiconductor substrate or substrate assembly and allowing the at least one compound to chemisorb to at least one surface of the semiconductor substrate or substrate assembly; providing at least one reaction gas; and directing the at least one reaction gas to the semiconductor substrate or substrate assembly with the chemisorbed species thereon to form a metal-containing layer on at least one surface of the semiconductor substrate or substrate assembly.

In certain applications, it may be advantageous to include deposition of a metal-containing precursor composition in addition to, and different from, the precursor composition of Formula I. To this end the present invention is further directed in yet another aspect to a method of manufacturing a semiconductor structure, the method including: providing a semiconductor substrate or substrate assembly; providing a vapor including at least one precursor compound of the formula $M(OR^1)_{5-x}(XR^2O)_x$ (Formula I), wherein M is selected from the group consisting of niobium and vanadium, X is $(NR^3R^4)$, $(PR^3R^4)$, or $(OR^5)$, each $R^1$, $R^2$, $R^3$, $R^4$, and $R^5$ is independently an organic group, x=1 or 2; providing a vapor including at least one metal-containing precursor compound different than $M(OR^1)_{5-x}(X(R^2O)_x$ (Formula I); directing the vapor including the at least one precursor compound of Formula I and the vapor including the at least one metal-containing precursor compound different that the precursor compound of Formula I to the semiconductor substrate or substrate assembly to form a metal-containing layer on at least one surface of the semiconductor substrate or substrate assembly using an atomic layer deposition process including a plurality of deposition cycles.

It is further recognized that the present invention may be useful in the formation of a niobium oxide layer on any appropriate substrate for any application wherein such a layer is desired. Thus, in another aspect the present invention is directed to a method of forming a niobium oxide layer on a substrate, the method including: providing a substrate; providing a vapor including at least one precursor compound of the formula $M(OR^1)_{5-x}(XR^2O)_x$ (Formula I), wherein M is niobium, X is $(NR^3R^4)$, $(PR^3R^4)$, or $(OR^5)$, each $R^1$, $R^2$, $R^3$, $R^4$, and $R^5$ is independently an organic group, x=1 or 2; and contacting the vapor including the at least one precursor compound with the substrate to form a niobium oxide layer on at least one surface of the substrate using an atomic layer deposition process including a plurality of deposition cycles.

Additionally, the present invention contemplates the formation of a niobium oxide layer on a substrate including the use of a reaction gas in the method. Therefore, in yet a further aspect, the present invention is directed to a method of forming a niobium oxide layer on a substrate, the method including: providing a substrate; providing a vapor including at least one precursor compound of the formula $M(OR^1)_{5-x}(XR^2O)_x$ (Formula I), wherein M is niobium, X is $(NR^3R^4)$, $(PR^3R^4)$, or $(OR^5)$, each $R^1$, $R^2$, $R^3$, $R^4$, and $R^5$ is independently an organic group, x=1 or 2; providing at least one reaction gas; and contacting the vapor including the at least one precursor compound with the substrate to form a niobium oxide layer on at least one surface of the substrate using an atomic layer deposition process including a plurality of deposition cycles.

The present invention, in yet another aspect, is directed to a method of forming a niobium oxide layer on a substrate, the method including: providing a substrate within a deposition chamber; providing a vapor including at least one precursor compound of the formula $M(OR^1)_{5-x}(XR^2O)_x$ (Formula I), wherein M is niobium, X is $(NR^3R^4)$, $(PR^3R^4)$, or $(OR^5)$, each $R^1$, $R^2$, $R^3$, $R^4$, and $R^5$ is independently an organic group, x=1 or 2; directing the vapor including the at least one precursor compound of Formula I to the substrate and allowing the at least one compound to chemisorb to at least one surface of the substrate; providing at least one reaction gas; and directing the at least one reaction gas to the substrate with the chemisorbed species thereon to form a niobium oxide layer on at least one surface of the substrate.

Methods of the present invention are also useful in the formation of a niobium oxide layer on a substrate where deposition of an additional metal-containing precursor is desired. To this end, in a further aspect the present invention is directed to a method of forming a niobium oxide layer on a substrate, the method including: providing a substrate; providing a vapor including at least one precursor compound of the formula $M(OR^1)_{5-x}(XR^2O)_x$ (Formula I), wherein M is niobium, X is $(NR^3R^4)$, $(PR^3R^4)$, or $(OR^5)$, each $R^1$, $R^2$, $R^3$, $R^4$, and $R^5$ is independently an organic group, x=1 or 2; providing a vapor including at least one metal-containing precursor compound different than $M(OR^1)_{5-x}(X(R^2O)_x$ (Formula I); directing the vapor including the at least one precursor compound of Formula I and the vapor including the at least one metal-containing precursor compound different that the precursor compound of Formula I to the substrate to form a layer including niobium oxide on at least one surface of the substrate using an atomic layer deposition process including a plurality of deposition cycles.

Additionally, methods of the present invention may advantageously be used in the manufacture of memory devices. Thus, in yet a further aspect, the present invention is also directed to a method of manufacturing a memory device structure, the method including: providing a substrate having a first electrode thereon; providing at least one precursor compound of the formula $M(OR^1)_{5-x}(XR^2O)_x$ (Formula I), wherein M is selected from the group consisting of niobium and vanadium, X is $(NR^3R^4)$, $(PR^3R^4)$, or $(OR^5)$, each $R^1$, $R^2$, $R^3$, $R^4$, and $R^5$ is independently an organic group, x=1 or 2; vaporizing the at least one precursor compound of Formula I; contacting the at least one vaporized precursor compound of Formula I with the substrate to chemisorb the compound on the first electrode of the substrate; providing at least one reaction gas; contacting the at least one reaction gas with the substrate with the chemisorbed compound thereon to form a dielectric layer on the first electrode of the substrate; and forming a second electrode on the dielectric layer.

Further, the present invention also provides an apparatus useful for the deposition of precursor compositions as taught herein. In yet another aspect, therefore, the present invention is directed to an atomic layer vapor deposition apparatus including: a deposition chamber having a substrate positioned therein; and at least one vessel including at least one precursor compound of the formula $M(OR^1)_{5-x}(XR^2O)_x$ (Formula I), wherein M is selected from the group consisting of niobium and vanadium, X is $(NR^3R^4)$, $(PR^3R^4)$, or $(OR^5)$, each $R^1$, $R^2$, $R^3$, $R^4$, and $R^5$ is independently an organic group, and x=1 or 2.

DETAILED DESCRIPTION OF PREFERRED EMBODIMENTS OF THE INVENTION

Figure 1:
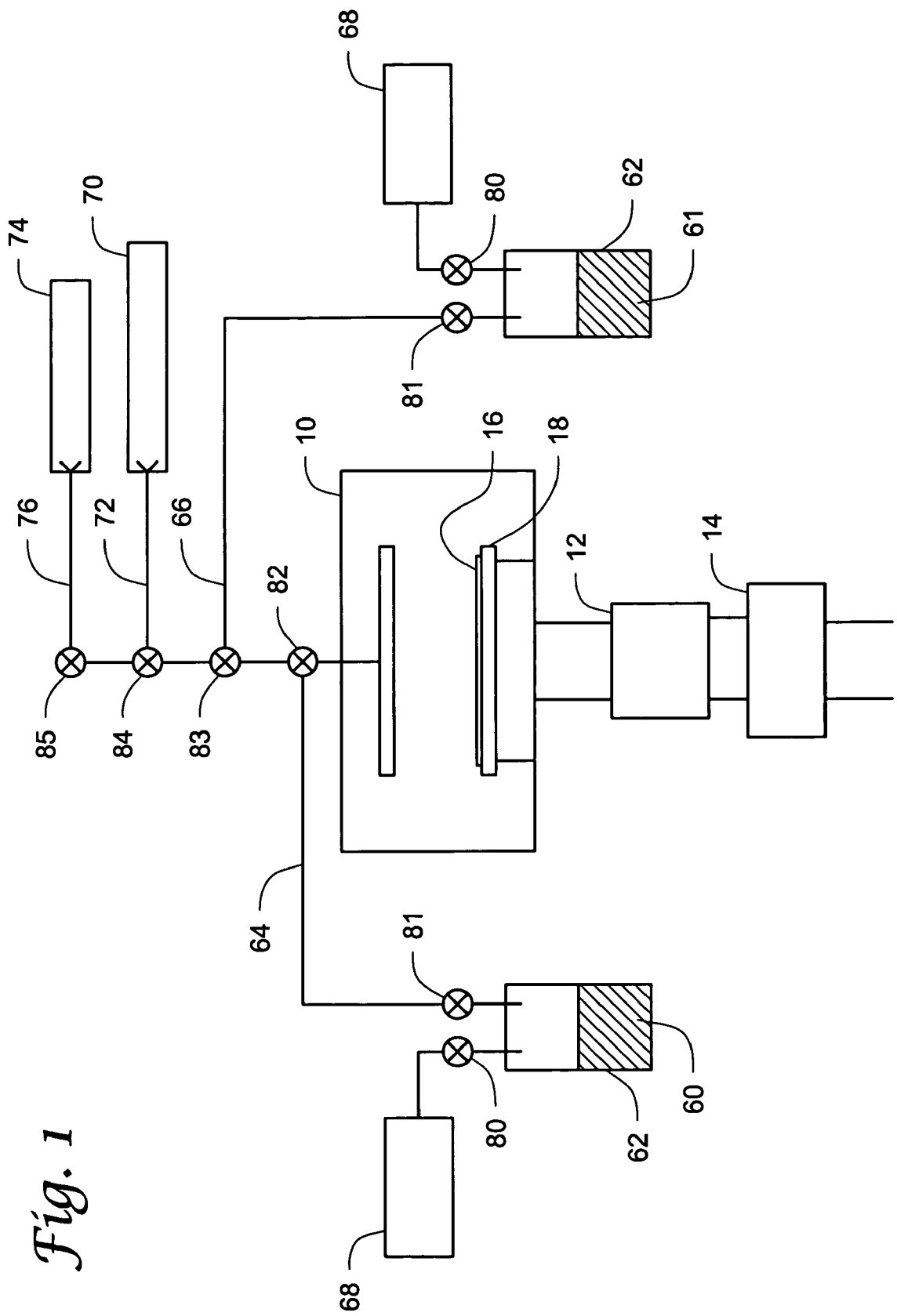
FIG. 1 is a perspective view of a vapor deposition coating system suitable for use in the method of the present invention.

The present invention includes a method of forming metal containing layers, preferably metal oxide layers, on substrates, preferably by using an atomic vapor deposition process and using one or more metal precursor compounds, wherein metal is selected from the group of niobium and vanadium. The atomic layer deposition process may, preferably, include a plurality of deposition cycles.

The terms "semiconductor substrate" or "substrate assembly" as used herein refer to a semiconductor substrate such as a base semiconductor layer or a semiconductor substrate having one or more layers, structures, or regions formed thereon.

A base semiconductor layer is typically the lowest layer of silicon material on a wafer or a silicon layer deposited on another material, such as silicon on sapphire. When reference is made to a substrate assembly, various process steps may have been previously used to form or define regions, junctions, various structures or features, and openings such as capacitor plates or barriers for capacitors.

The term "layer" as used herein refers to any metal-containing layer that can be formed on a substrate from the precursor compounds of this invention using a vapor deposition process. The term "layer" is meant to include layers specific to the semiconductor industry, such as "barrier layer," "dielectric layer," and "conductive layer." (The term "layer" is synonymous with the term "film" frequently used in the semiconductor industry.) The term "layer" is also meant to include layers found in technology outside of semiconductor technology, such as coatings on glass.

The terms "deposition process" and "vapor deposition process" as used herein refer to a process in which a metal-containing layer is formed on one or more surfaces of a substrate (e.g., a doped polysilicon wafer) from vaporized precursor compound(s). Specifically, one or more metal precursor compounds are vaporized and directed to and/or contacted with one or more surfaces of a heated substrate (e.g., semiconductor substrate or substrate assembly) placed in a deposition chamber. These precursor compounds form (e.g., by reacting or decomposing) a non-volatile, thin, uniform, metal-containing layer on the surface(s) of the substrate. For the purposes of this invention, the term "vapor deposition process" is meant to include both chemical vapor deposition processes (including pulsed chemical vapor deposition processes) and atomic layer deposition processes.

The term "atomic layer deposition" (ALD) as used herein refers to a vapor deposition process in which numerous consecutive deposition cycles are conducted in a deposition chamber. Typically, during each cycle the metal precursor is chemisorbed to the substrate surface; excess precursor is purged out; a subsequent precursor and/or reaction gas is introduced to react with the chemisorbed layer; and excess reaction gas (if used) and by-products are removed. As compared to a typical chemical vapor deposition (CVD) process wherein the desired layer is deposited in a single cycle onto the substrate from vaporized metal precursor compounds (and any reaction gasses used) within a deposition chamber, the longer duration multi-cycle ALD process allows for improved control of layer thickness by self-limiting layer growth and minimizing detrimental gas phase reactions by separation of the reaction components. The term "atomic layer deposition" as used herein is also meant to include the related terms "atomic layer epitaxy" (ALE), molecular beam epitaxy (MBE), gas source MBE, organometallic MBE, and chemical beam epitaxy when performed with alternating pulses of precursor compound(s), reaction gas(es), and purge (i.e., inert carrier) gas.

The term "chemisorption" as used herein refers to the chemical adsorption of vaporized reactive precursor compounds on the surface of a substrate. The adsorbed species are irreversibly bound to the substrate surface as a result of relatively strong binding forces characterized by high adsorption energies (e.g., >30 kcal/mol), comparable in strength to ordinary chemical bonds. The chemisorbed species typically form a monolayer on the substrate surface. (See "The Condensed Chemical Dictionary", 10th edition, revised by G. G. Hawley, published by Van Nostrand Reinhold Co., New York, 225 (1981)). The technique of ALD is based on the principle of the formation of a saturated monolayer of reactive precursor molecules by chemisorption. In ALD one or more appropriate precursor compounds or reaction gasses are alternately introduced (e.g., pulsed) into a deposition chamber and chemisorbed onto the surfaces of a substrate. Each sequential introduction of a reactive compound (e.g., one or more precursor compounds and one or more reaction gasses) is typically separated by an inert carrier gas purge. Each precursor compound co-reaction adds a new atomic layer to previously deposited layers to form a cumulative solid layer. The cycle is repeated, typically for several hundred times, to gradually form the desired layer thickness. It should be understood that ALD can alternately utilize one precursor compound, which is chemisorbed, and one reaction gas, which reacts with the chemisorbed species.

The present invention includes methods of forming a metal containing layer, preferably a metal oxide layer such as, for example, a niobium oxide layer, on a substrate. Further, such metal containing layer is preferably formed on a semiconductor substrate or substrate assembly in the manufacture of a semiconductor structure or another memory device structure. Such layers are deposited or chemisorbed onto a substrate and form, preferably, dielectric layers. The methods of the present invention involve forming a layer on a substrate by using one or more metal precursor compounds of the formula:

$$M(OR^1)_{5-x}(XR^2O)_x \qquad \text{(Formula I)}$$

wherein M is selected from niobium and vanadium, X is $(NR^3R^4)$, $(PR^3R^4)$, or $(OR^5)$, x is 1 or 2, and each $R^1$, $R^2$, $R^3$, $R^4$, and $R^5$ is independently an organic group (as described in greater detail below). Additionally, the present invention includes methods of forming a metal containing layer further including using a precursor compound in addition to and different from the compound of Formula I. An apparatus useful for atomic layer deposition (ALD, discussed more fully below) of the disclosed precursor compounds is also disclosed.

As used herein, the term "organic group" is used for the purpose of this invention to mean a hydrocarbon group that is classified as an aliphatic group, cyclic group, or combination of aliphatic and cyclic groups (e.g., alkaryl and aralkyl groups). In the context of the present invention, suitable organic groups for precursor compounds of this invention are those that do not interfere with the formation of a metal oxide layer using vapor deposition techniques. In the context of the present invention, the term "aliphatic group" means a saturated or unsaturated linear or branched hydrocarbon group. This term is used to encompass alkyl, alkenyl, and alkynyl groups, for example. The term "alkyl group" means a saturated linear or branched monovalent hydrocarbon group including, for example, methyl, ethyl, n-propyl, isopropyl, t-butyl, amyl, heptyl, and the like. The term "alkenyl group" means an unsaturated, linear or branched monovalent hydrocarbon group with one or more olefinically unsaturated groups (i.e., carbon-carbon double bonds), such as a vinyl group. The term "alkynyl group" means an unsaturated, linear or branched monovalent hydrocarbon group with one or more carbon-carbon triple bonds. The term "cyclic group" means a closed ring hydrocarbon group that is classified as an alicyclic group, aromatic group, or heterocyclic group. The term "alicyclic group" means a cyclic hydrocarbon group having properties resembling those of aliphatic groups. The term "aromatic group" or "aryl group" means a mono- or polynuclear aromatic hydrocarbon group. The term "heterocyclic group" means a closed ring hydrocarbon in which one or more of the atoms in the ring is an element other than carbon (e.g., nitrogen, oxygen, sulfur, etc.).

As a means of simplifying the discussion and the recitation of certain terminology used throughout this application, the terms "group" and "moiety" are used to differentiate between chemical species that allow for substitution or that may be substituted and those that do not so allow for substitution or may not be so substituted. Thus, when the term "group" is used to describe a chemical substituent, the described chemical material includes the unsubstituted group and that group with nonperoxidic O, N, S, Si, or F atoms, for example, in the chain as well as carbonyl groups or other conventional substituents. Where the term "moiety" is used to describe a chemical compound or substituent, only an unsubstituted chemical material is intended to be included. For example, the phrase "alkyl group" is intended to include not only pure open chain saturated hydrocarbon alkyl substituents, such as methyl, ethyl, propyl, t-butyl, and the like, but also alkyl substituents bearing further substituents known in the art, such as hydroxy, alkoxy, alkylsulfonyl, halogen atoms, cyano, nitro, amino, carboxyl, etc. Thus, "alkyl group" includes ether groups, haloalkyls, nitroalkyls, carboxyalkyls, hydroxyalkyls, sulfoalkyls, etc. On the other hand, the phrase "alkyl moiety" is limited to the inclusion of only pure open chain saturated hydrocarbon alkyl substituents, such as methyl, ethyl, propyl, t-butyl, and the like.

In Formula I, M is a metal selected from the group of niobium and vanadium and X is $(NR^3R^4)$, $(PR^3R^4)$, or $(OR^5)$, with $R^1$, $R^2$, $R^3$, $R^4$, and $R^5$ of Formula I being each individually an organic group. Preferably, each of the organic groups of $R^1$, $R^2$, $R^3$, $R^4$, and $R^5$ contain 1-10 carbon atoms, more preferably, 1-6 carbon atoms, and most preferably, 1-4 carbon atoms. Preferably, $R^2$ is $(CH_2)_n$, with n=1-5.

Additionally, each of the organic groups $R^1$, $R^2$, $R^3$, $R^4$, and $R^5$ may optionally include one or more heteroatoms (e.g., oxygen, nitrogen, fluorine, etc.), or functional groups (e.g., carbonyl groups, hydroxycarbyl groups, aminocarbyl groups, alcohols, fluorinated alcohols, etc.). That is, included within the scope of the compounds of Formula I are compounds wherein at least one atom in the organic group has been replaced with, for example, one of a carbonyl group, a hydroxycarbyl group, an oxygen atom, a nitrogen atom, or an aminocarbyl group. Certain preferred organic groups, $R^1$, $R^3$, $R^4$, and $R^5$, of Formula I include (C1-C4) alkyl groups, which may be linear, branched, or cyclic groups, as well as alkenyl groups (e.g., dienes and trienes), or alkynyl groups.

Examples of precursor compounds of Formula I include $Nb(OEt)_4(Me_2NCH_2CH_2O)$ (also known as niobium tetraethoxy dimethylaminoethoxide or NbTDMAE), and $Nb(OEt)_4(MeOCH_2CH_2O)$, wherein Me is methyl, and Et is ethyl.

In addition to the precursor compositions of Formula I, the present invention includes methods and apparatus in which a metal containing precursor compound different that the precursor compound of Formula I may be used. Such precursors may be deposited/chemisorbed, for example in an ALD process discussed more fully below, substantially simultaneously with or sequentially to the precursor compounds of Formula I. Further, the different precursor compound may be deposited/chemisorbed in a deposition cycle either prior to or subsequently to introducing a reaction gas to the substrate or substrate assembly. These different metal containing precursor compounds may preferably include at least one metal selected from the group of bismuth, tantalum, hafnium, aluminum, niobium, vanadium, and combinations of these metals.

The precursor compounds of the present invention may be prepared according to any appropriate method known to one skilled in the art. For instance, the precursor may be prepared by reacting a metal alkoxide with one equivalent of an alcohol having an extra donor function, as illustrated, for example, in the following reaction:

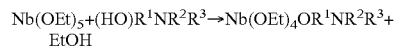

$Nb(OEt)_5 + (HO)R^1NR^2R^3 \rightarrow Nb(OEt)_4OR^1NR^2R^3 + EtOH$

Herein, vaporized precursor compounds may be used either alone or optionally with vaporized molecules of other precursor compounds or optionally with vaporized solvent molecules, if used. As used herein, "liquid" refers to a solution or a neat liquid (a liquid at room temperature or a solid at room temperature that melts at an elevated temperature). As used herein, "solution" does not require complete solubility of the solid but may allow for some undissolved solid, as long as there is a sufficient amount of the solid delivered by the organic solvent into the vapor phase for chemical vapor deposition processing. If solvent dilution is used in deposition, the total molar concentration of solvent vapor generated may also be considered as a inert carrier gas.

Solvents that are suitable for some embodiments of the present invention can be one or more of the following: aliphatic hydrocarbons or unsaturated hydrocarbons (C3-C20, and preferably C5-C10, cyclic, branched, or linear), aromatic hydrocarbons (C5-C20, and preferably C5-C10), halogenated hydrocarbons, silylated hydrocarbons such as alkylsilanes, alkylsilicates, ethers, polyethers, thioethers, esters, lactones, ammonia, amides, amines (aliphatic or aromatic, primary, secondary, or tertiary), polyamines, nitrites, cyanates, isocyanates, thiocyanates, silicone oils, alcohols, or compounds containing combinations of any of the above or mixtures of one or more of the above. The compounds are also generally compatible with each other, so that mixtures of variable quantities of the precursor compounds will not interact to significantly change their physical properties.

The precursor compounds of the present invention can, optionally, be vaporized and deposited/chemisorbed substantially simultaneously with, and in the presence of, one or more reaction gasses. Alternatively, the metal containing layers may be formed by alternately introducing the precursor compound and the reaction gas(es) during each deposition cycle. Such reaction gasses may typically include oxygen, water vapor, ozone, nitrogen oxides, sulfur oxides, hydrogen, hydrogen sulfide, hydrogen selenide, hydrogen telluride, hydrogen peroxide, ammonia, organic amine, silane, disilane and higher silanes, diborane, plasma, air, and any combination of these gasses. Preferable optional reaction gasses include oxygen and ozone. A most preferred optional reaction gas is ozone.

Additionally, the precursor compounds can be vaporized in the presence of one or more inert (i.e., nonreactive) carrier gasses if desired. Such inert carrier gasses may also be used in purging steps in an ALD process, for example. The inert carrier gas typically includes, but is not limited to, nitrogen, helium, argon, and combinations thereof. In the context of the present invention, an inert carrier gas is understood to be a gas that does not substantially interfere with the formation of the metal-containing layer.

The substrate on which the metal oxide layer is formed is preferably a semiconductor substrate or substrate assembly. Any suitable semiconductor material is contemplated, such as for example, borophosphosilicate glass (BPSG), silicon such as, e.g., conductively doped polysilicon, monocrystalline silicon, etc. (for this invention, appropriate forms of silicon are simply referred to as "silicon"), for example in the form of a silicon wafer, tetraethylorthosilicate (TEOS) oxide, spin on glass (i.e., a thin layer of $SiO_2$, optionally doped, deposited by a spin on process), TiN, TaN, W, noble metals, etc. A substrate assembly may also contain a layer that includes platinum, iridium, rhodium, ruthenium, ruthenium oxide, titanium nitride, tantalum nitride, tantalum-silicon-nitride, silicon dioxide, aluminum, gallium arsenide, glass, etc., and other existing or to-be-developed materials used in semiconductor constructions, such as dynamic random access memory (DRAM) devices and static random access memory (SRAM) devices, for example.

For substrates including semiconductor substrates or substrate assemblies, the layers can be formed directly on the lowest semiconductor surface of the substrate, or they can be formed on any of a variety of the layers (i.e., surfaces) as in a patterned wafer, for example.

Substrates other than semiconductor substrates or substrate assemblies can also be used in methods of the present invention. Any substrate that may advantageously form a metal containing layer thereon, such as a metal oxide layer, may be used, such substrates including, for example, fibers, wires, etc.

A preferred deposition process for the present invention is a vapor deposition process. Vapor deposition processes are generally favored in the semiconductor industry due to the process capability to quickly provide highly conformal layers even within deep contacts and other openings. Chemical vapor deposition (CVD) and atomic layer deposition (ALD) are two vapor deposition processes often employed to form thin, continuous, uniform, metal-containing (preferably dielectric) layers onto semiconductor substrates. Using either vapor deposition process, typically one or more precursor compounds are vaporized in a deposition chamber and optionally combined with one or more reaction gasses and directed to and/or contacted with the substrate to form a metal-containing layer on the substrate. It will be readily apparent to one skilled in the art that the vapor deposition process may be enhanced by employing various related techniques such as plasma assistance, photo assistance, laser assistance, as well as other techniques.

Chemical vapor deposition (CVD) has been extensively used for the preparation of metal-containing layers, such as dielectric layers, in semiconductor processing because of its ability to provide highly conformal and high quality dielectric layers at relatively fast processing times. Typically, the desired precursor compounds are vaporized and then introduced into a deposition chamber containing a heated substrate with optional reaction gasses and/or inert carrier gasses in a single deposition cycle. In a typical CVD process, vaporized precursors are contacted with reaction gas(es) at the substrate surface to form a layer (e.g., dielectric layer). The single deposition cycle is allowed to continue until the desired thickness of the layer is achieved.

Typical CVD processes generally employ precursor compounds in vaporization chambers that are separated from the process chamber wherein the deposition surface or wafer is located. For example, liquid precursor compounds are typically placed in bubblers and heated to a temperature at which they vaporize, and the vaporized liquid precursor compound is then transported by an inert carrier gas passing over the bubbler or through the liquid precursor compound. The vapors are then swept through a gas line to the deposition chamber for depositing a layer on substrate surface(s) therein. Many techniques have been developed to precisely control this process. For example, the amount of precursor material transported to the deposition chamber can be precisely controlled by the temperature of the reservoir containing the precursor compound and by the flow of an inert carrier gas bubbled through or passed over the reservoir.

Alternatively, and preferably, the vapor deposition process employed in the methods of the present invention is a multi-cycle atomic layer deposition (ALD) process. Such a process is advantageous, in particular advantageous over a CVD process, in that in provides for improved control of atomic-level thickness and uniformity to the deposited layer (e.g., dielectric layer) by providing a plurality of deposition cycles. Further, ALD processes typically expose the metal precursor compounds to lower volatilization and reaction temperatures, which tends to decrease degradation of the precursor as compared to, for example, typical CVD processes.

Generally in an ALD process, each reactant is pulsed sequentially onto a suitable substrate, typically at deposition temperatures of about 25° C. to about 400° C. (preferably about 150° C. to about 300° C.). These temperatures are generally lower than those presently used in CVD processes, which typically include deposition temperatures at the substrate surface in a range of about 100° C. to about 600° C., more preferably in the range of about 200° C. to about 500° C. Under such conditions the film growth is typically self-limiting (i.e., when the reactive sites on a surface are used up in an ALD process, the deposition generally stops), insuring not only excellent conformality but also good large area uniformity plus simple and accurate thickness control. Due to alternate dosing of the precursor compounds and/or reaction gasses, detrimental vapor-phase reactions are inherently eliminated, in contrast to the CVD process that is carried out by continuous coreaction of the precursors and/or reaction gasses. (See Vehkamäki et al, "Growth of $SrTiO_3$ and $BaTiO_3$ Thin Films by Atomic Layer Deposition," Electrochemical and Solid-State Letters, 2(10):504-506 (1999)).

A typical ALD process includes exposing an initial substrate to a first chemical species (e.g., a metal precursor compound such as that of Formula I) to accomplish chemisorption of the species onto the substrate. Theoretically, the chemisorption forms a monolayer that is uniformly one atom or molecule thick on the entire exposed initial substrate. In other words, a saturated monolayer is substantially formed on the substrate surface. Practically, chemisorption may not occur on all portions of the substrate. Nevertheless, such a partial monolayer is still understood to be a monolayer in the context of the present invention. In many applications, merely a substantially saturated monolayer may be suitable. A substantially saturated monolayer is one that will still yield a deposited layer exhibiting the quality and/or properties desired for such layer.

The first species is purged from over the substrate and a second chemical species (e.g., a different precursor compound) is provided to react with the first monolayer of the first species. The second species is then purged and the steps are repeated with exposure of the second species monolayer to the first species. In some cases, the two monolayers may be of the same species. Optionally, the second species can react with the first species, but not chemisorb additional material thereto. That is, the second species can cleave some portion of the chemisorbed first species, altering such monolayer without forming another monolayer thereon. Also, a third species or more may be successively chemisorbed (or reacted) and purged just as described for the first and second species. Optionally, the second species (or third or subsequent) can include at least one reaction gas if desired.

Thus, the use of ALD provides the ability to improve the control of thickness and uniformity of metal containing layers on a substrate. For example, depositing thin layers of precursor compound in a plurality of cycles provides a more accurate control of ultimate film thickness. This is particularly advantageous when the precursor compound is directed to the substrate and allowed to chemisorb thereon, preferably further including at least one reaction gas that reacts with the chemisorbed species on the substrate, and even more preferably wherein this cycle is repeated at least once.

Purging of excess vapor of each species following deposition/chemisorption onto a substrate may involve a variety of techniques including, but not limited to, contacting the substrate and/or monolayer with an inert carrier gas and/or lowering pressure to below the deposition pressure to reduce the concentration of a species contacting the substrate and/or chemisorbed species. Examples of carrier gasses, as discussed above, may include $N_2$, Ar, He, etc. Additionally, purging may instead include contacting the substrate and/or monolayer with any substance that allows chemisorption byproducts to desorb and reduces the concentration of a contacting species preparatory to introducing another species. The contacting species may be reduced to some suitable concentration or partial pressure known to those skilled in the art based on the specifications for the product of a particular deposition process.

ALD is often described as a self-limiting process, in that a finite number of sites exist on a substrate to which the first species may form chemical bonds. The second species might only bond to the first species and thus may also be self-limiting. Once all of the finite number of sites on a substrate are bonded with a first species, the first species will often not bond to other of the first species already bonded with the substrate. However, process conditions can be varied in ALD to promote such bonding and render ALD not self-limiting. Accordingly, ALD may also encompass a species forming other than one monolayer at a time by stacking of a species, forming a layer more than one atom or molecule thick.

Thus, during the ALD process, numerous consecutive deposition cycles are conducted in the deposition chamber, each cycle depositing a very thin metal-containing layer (usually less than one monolayer such that the growth rate on average is from about 0.2 to about 3.0 Angstroms per cycle), until a layer of the desired thickness is built up on the substrate of interest. The layer deposition is accomplished by alternately introducing (i.e., by pulsing) precursor compound(s) into the deposition chamber containing a substrate, chemisorbing the precursor compound(s) as a monolayer onto the substrate surfaces, purging the deposition chamber, then introducing to the chemisorbed precursor compound(s) precursor compound(s) that may be the same as the first precursor compound(s) or may be other precursor compound(s) in a plurality of deposition cycles until the desired thickness of the metal-containing layer is achieved. Preferred thicknesses of the metal containing layers of the present invention are at least about 10 angstroms (Å), and preferably no greater than about 100 Å.

The pulse duration of precursor compound(s) and inert carrier gas(es) is generally of a duration sufficient to saturate the substrate surface. Typically, the pulse duration is from about 0.1 second to about 5 seconds, preferably from about 0.2 second to about 3 seconds, and more preferably from about 2 seconds to about 3 seconds.

In comparison to the predominantly thermally driven CVD, ALD is predominantly chemically driven. Thus, ALD may advantageously be conducted at much lower temperatures than CVD. During the ALD process, the substrate temperature may be maintained at a temperature sufficiently low to maintain intact bonds between the chemisorbed precursor compound(s) and the underlying substrate surface and to prevent decomposition of the precursor compound(s). The temperature, on the other hand, may be sufficiently high to avoid condensation of the precursor compound(s). Typically the substrate temperature is kept within the range of about 25° C. to about 400° C. (preferably about 150° C. to about 300° C., and more preferably about 250° C. to about 300° C.), which, as discussed above, is generally lower than temperatures presently used in typical CVD processes. Thus, the first species or precursor compound is chemisorbed at this temperature. Surface reaction of the second species or precursor compound can occur at substantially the same temperature as chemisorption of the first precursor or, optionally but less preferably, at a substantially different temperature. Clearly, some small variation in temperature, as judged by those of ordinary skill, can occur but still be considered substantially the same temperature by providing a reaction rate statistically the same as would occur at the temperature of the first precursor chemisorption. Alternatively, chemisorption and subsequent reactions could instead occur at substantially exactly the same temperature.

For a typical ALD process, the pressure inside the deposition chamber is kept at about $10^{-4}$ torr to about 10 torr, preferably about $10^{-4}$ torr to about 1 torr. Typically, the deposition chamber is purged with an inert carrier gas after the vaporized precursor compound(s) have been introduced into the chamber and/or reacted for each cycle. The inert carrier gas(es) can also be introduced with the vaporized precursor compound(s) during each cycle.

The reactivity of a precursor compound can significantly influence the process parameters in ALD. Under typical CVD process conditions, a highly reactive compound may react in the gas phase generating particulates, depositing prematurely on undesired surfaces, producing poor films, and/or yielding poor step coverage or otherwise yielding non-uniform deposition. For at least such reason, a highly reactive compound might be considered not suitable for CVD. However, some compounds not suitable for CVD are superior ALD precursors. For example, if the first precursor is gas phase reactive with the second precursor, such a combination of compounds might not be suitable for CVD, although they could be used in ALD. In the CVD context, concern might also exist regarding sticking coefficients and surface mobility, as known to those skilled in the art, when using highly gas-phase reactive precursors, however, little or no such concern would exist in the ALD context.

After layer formation on the substrate, an annealing process may be optionally performed in situ in the deposition chamber in a nitrogen atmosphere or oxidizing atmosphere. Preferably, the annealing temperature is within the range of about 400° C. to about 1000° C. Particularly after ALD, the annealing temperature is more preferably about 400° C. to about 750° C., and most preferably about 600° C. to about 700° C. The annealing operation is preferably performed for a time period of about 0.5 minute to about 60 minutes and more preferably for a time period of about 1 minute to about 10 minutes. One skilled in the art will recognize that such temperatures and time periods may vary. For example, furnace anneals and rapid thermal annealing may be used, and further, such anneals may be performed in one or more annealing steps.

As stated above, the use of the complexes and methods of forming films of the present invention are beneficial for a wide variety of thin film applications in semiconductor structures, particularly those using high dielectric materials. For example, such applications include gate dielectrics and capacitors such as planar cells, trench cells (e.g., double sidewall trench capacitors), stacked cells (e.g., crown, V-cell, delta cell, multi-fingered, or cylindrical container stacked capacitors), as well as field effect transistor devices.

A system that can be used to perform vapor deposition processes (chemical vapor deposition or atomic layer deposition) of the present invention is shown in FIG. 1. The system includes an enclosed vapor deposition chamber 10, in which a vacuum may be created using turbo pump 12 and backing pump 14. One or more substrates 16 (e.g., semiconductor substrates or substrate assemblies) are positioned in chamber 10. A constant nominal temperature is established for substrate 16, which can vary depending on the process used. Substrate 16 may be heated, for example, by an electrical resistance heater 18 on which substrate 16 is mounted. Other known methods of heating the substrate may also be utilized.

In this process, precursor compound(s) (such as the precursor compound of Formula I and optionally metal containing precursor compound(s) different than the precursor compound of Formula I) 60 and/or 61 are stored in vessels 62. The precursor compound(s) are vaporized and separately fed along lines 64 and 66 to the deposition chamber 10 using, for example, an inert carrier gas 68. A reaction gas 70 may be supplied along line 72 as needed. Also, a purge gas 74, which is often the same as the inert carrier gas 68, may be supplied along line 76 as needed. As shown, a series of valves 80-85 are opened and closed as required.

Figure 2:
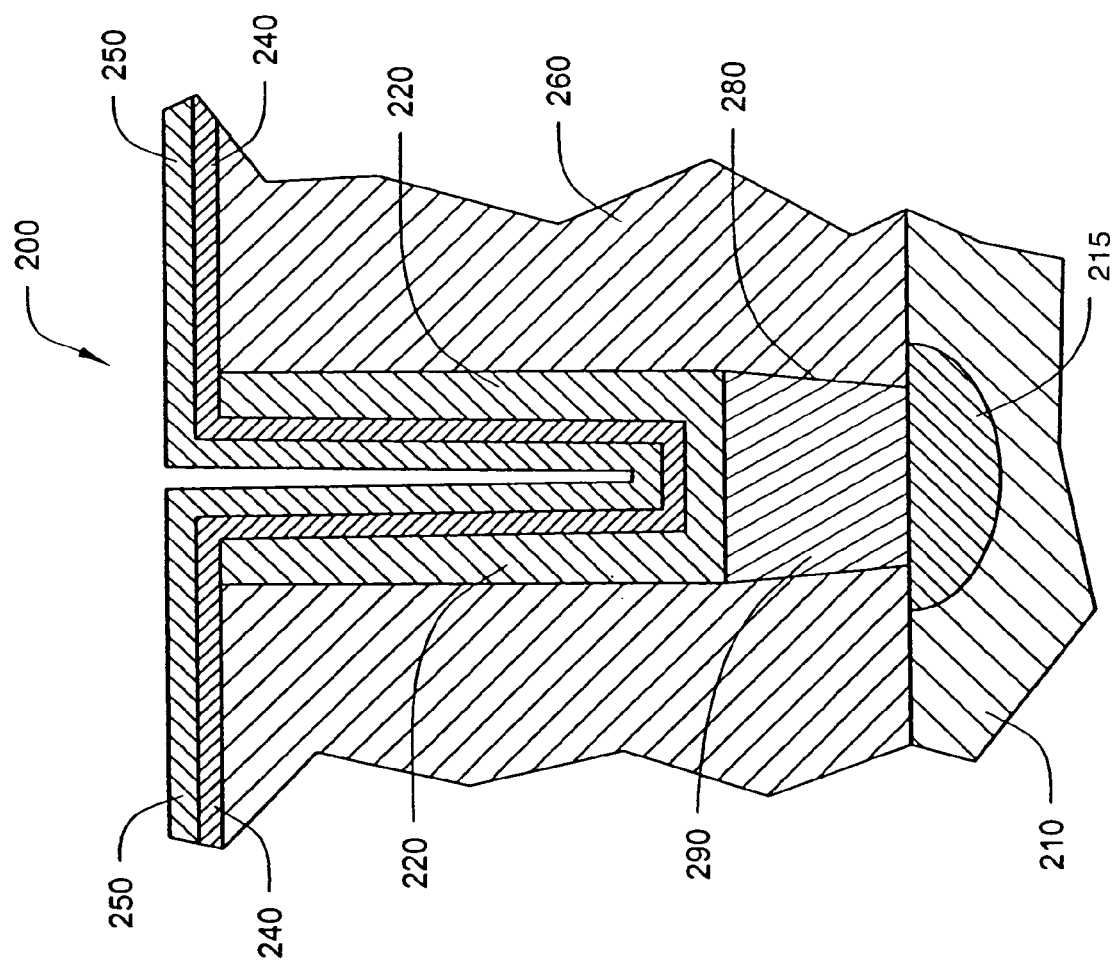
FIG. 2 is an exemplary capacitor construction formed using methods of the present invention.

FIG. 2 shows an example of the ALD formation of niobium and/or vanadium-containing layers of the present invention as used in an exemplary capacitor construction. Referring to FIG. 2, capacitor construction 200 includes substrate 210 having conductive diffusion area 215 formed therein. Substrate 210 can include, for example, silicon. An insulating layer 260, such as BPSG, is provided over substrate 210, with contact opening 280 provided therein to diffusion area 215. Conductive material 290 fills contact opening 280, and may include, for example, tungsten or conductively doped polysilicon. Capacitor construction 200 includes a first capacitor electrode (a bottom electrode) 220, a dielectric layer 240 which may be formed by methods of the present invention, and a second capacitor electrode (a top electrode) 250.

It is to be understood that FIG. 2 is an exemplary construction, and methods of the invention are useful for forming niobium oxide layers and/or vanadium oxide layers on any substrate, preferably on semiconductor structures, and that such applications include capacitors such as planar cells, trench cells, (e.g., double sidewall trench capacitors), stacked cells (e.g., crown, V-cell, delta cell, multi-fingered, or cylindrical container stacked capacitors), as well as field effect transistor devices.

Furthermore, a diffusion barrier layer may optionally be formed over the dielectric layer 240, and may, for example, include TiN, TaN, metal silicide, or metal silicide-nitride. While the diffusion barrier layer is described as a distinct layer, it is to be understood that the barrier layers may include conductive materials and can accordingly, in such embodiments, be understood to include at least a portion of the capacitor electrodes. In certain embodiments that include a diffusion barrier layer, an entirety of a capacitor electrode can include conductive barrier layer materials.

The following examples are offered to further illustrate various specific embodiments and techniques of the present invention. It should be understood, however, that many variations and modifications understood by those of ordinary skill in the art may be made while remaining within the scope of the present invention. Therefore, the scope of the invention is not intended to be limited by the following example. Unless specified otherwise, all percentages shown in the examples are percentages by weight.

EXAMPLES

Example 1

Deposition of $Nb_2O_5$ by Atomic Layer Deposition

A $Nb_2O_5$ film was deposited on a TiN bottom electrode by ALD, as described above, using alternate pulses of $Nb(OEt)_4(Me_2NCH_2CH_2O)$ (NbTDMAE) and ozone ($O_3$) at a substrate temperature of 325° C. and a pressure of 1 Torr. The film was deposited at a rate of 0.35 Å/cycle, with each cycle consisting of a 2 second niobium precursor dose, 4 second purge with the inert gas, a 5 second ozone dose ($O_3$:500 sccm at 15%), and a 15 second purge with the inert gas. An approximately 72 Å thick $Nb_2O_5$ film resulted.

Example 2

Deposition of Ta/Nb Oxide by Atomic Layer Deposition

Example 1, above, was repeated, with the exception that both TaTDMAE and NbTDMAE precursors were deposited, the deposition rate was 0.425 Å/cycle, and an 8 second ozone dose was performed. The niobium appeared to be substantially homogeneously distributed throughout the resulting Ta/Nb oxide layer.

The complete disclosures of the patents, patent documents, and publications cited herein are incorporated by reference in their entirety as if each were individually incorporated. Various modifications and alterations to this invention will become apparent to those skilled in the art without departing from the scope and spirit of this invention. It should be understood that this invention is not intended to be unduly limited by the illustrative embodiments and examples set forth herein and that such examples and embodiments are presented by way of example only with the scope of the invention intended to be limited only by the claims set forth herein as follows.

What is claimed is:

1. A method of manufacturing a semiconductor structure, the method comprising:
    providing a semiconductor substrate or substrate assembly;
    providing a vapor comprising at least one precursor compound of the formula $M(OR^1)_{5-x}(XR^2O)_x$ (Formula I), wherein:
        M is selected from the group consisting of niobium and vanadium,
        X is $(NR^3R^4)$, $(PR^3R^4)$, or $(OR^5)$,
        each $R^1$, $R^2$, $R^3$, $R^4$, and $R^5$ is independently an organic group,
        x=1 or 2; and
    contacting the vapor comprising the at least one precursor compound of Formula I with the semiconductor substrate or substrate assembly to form a metal-containing layer on at least one surface of the semiconductor substrate or substrate assembly using an atomic layer deposition process comprising a plurality of deposition cycles.

2. The method of claim 1 wherein $R^1$, $R^2$, $R^3$, $R^4$, and $R^5$ are each independently organic groups having 1-10 carbon atoms.

3. The method of claim 2 wherein $R^2$ is $(CH_2)_n$, wherein n=1-5.

4. The method of claim 1 wherein the semiconductor substrate or substrate assembly comprises silicon, borophosphosilicate glass (BPSG), tetraethylorthosilicate (TEOS) oxide, spin on glass, TiN, TaN, W, noble metals, or combinations thereof.

5. The method of claim 1 wherein the metal-containing layer is a metal oxide layer.

6. The method of claim 1 wherein the metal-containing layer is a dielectric layer.

7. The method of claim 1 wherein the metal-containing layer has a thickness of about 10 Å to about 100 Å.

8. A method of manufacturing a semiconductor structure, the method comprising:
providing a semiconductor substrate or substrate assembly;
providing a vapor comprising at least one precursor compound of the formula $M(OR^1)_{5-x}(XR^2O)_x$ (Formula I), wherein:
M is selected from the group consisting of niobium and vanadium,
X is $(NR^3R^4)$, $(PR^3R^4)$, or $(OR^5)$,
each $R^1, R^2, R^3, R^4$, and $R^5$ is independently an organic group,
x=1 or 2;
providing at least one reaction gas; and
contacting the vapor comprising the at least one precursor compound of Formula I with the semiconductor substrate or substrate assembly to form a metal-containing layer on at least one surface of the semiconductor substrate or substrate assembly using an atomic layer deposition process comprising a plurality of deposition cycles.

9. The method of claim 8 wherein $R^1, R^2, R^3, R^4$, and $R^5$ are each independently organic groups having 1-10 carbon atoms.

10. The method of claim 9 wherein $R^2$ is $(CH_2)_n$, wherein n=1-5.

11. The method of claim 8 wherein the metal-containing layer is a metal oxide layer.

12. The method of claim 8 wherein the metal-containing layer is a dielectric layer.

13. The method of claim 8 wherein the at least one reaction gas is selected from the group consisting of oxygen, water vapor, ozone, nitrogen oxides, sulfur oxides, hydrogen, hydrogen sulfide, hydrogen selenide, hydrogen telluride, hydrogen peroxide, ammonia, organic amine, silane, disilane, higher silanes, diborane, plasma, air, and combinations thereof.

14. The method of claim 13 wherein the at least one reaction gas is selected from the group consisting of ozone and oxygen.

15. The method of claim 8 wherein during the atomic layer deposition process, the metal-containing layer is formed by alternately introducing the vapor comprising the at least one precursor compound of Formula I and the at least one reaction gas during each deposition cycle.

16. A method of manufacturing a semiconductor structure, the method comprising:
providing a semiconductor substrate or substrate assembly within a deposition chamber;
providing a vapor comprising at least one precursor compound of the formula $M(OR^1)_{5-x}(XR^2O)_x$ (Formula I), wherein:
M is selected from the group consisting of niobium and vanadium,
X is $(NR^3R^4)$, $(PR^3R^4)$, or $(OR^5)$,
each $R^1, R^2, R^3, R^4$, and $R^5$ is independently an organic group,
x=1 or 2;
directing the vapor comprising the at least one precursor compound of Formula I to the semiconductor substrate or substrate assembly and allowing the at least one compound to chemisorb to at least one surface of the semiconductor substrate or substrate assembly;
providing at least one reaction gas; and
directing the at least one reaction gas to the semiconductor substrate or substrate assembly with the chemisorbed species thereon to form a metal-containing layer on at least one surface of the semiconductor substrate or substrate assembly.

17. The method of claim 16 wherein providing a vapor comprising at least one precursor compound of Formula I, directing the vapor to the semiconductor substrate or substrate assembly, providing at least one reaction gas, and directing the at least one reaction gas to the semiconductor substrate or substrate assembly is repeated at least once.

18. The method of claim 16 wherein the at least one reaction gas is selected from the group consisting of oxygen, water vapor, ozone, nitrogen oxides, sulfur oxides, hydrogen, hydrogen sulfide, hydrogen selenide, hydrogen telluride, hydrogen peroxide, ammonia, organic amine, silane, disilane, higher silanes, diborane, plasma, air, and combinations thereof.

19. The method of claim 18 wherein the at least one reaction gas is selected from the group consisting of ozone and oxygen.

20. The method of claim 16 wherein $R^1, R^2, R^3, R^4$, and $R^5$ are each independently organic groups having 1-10 carbon atoms.

21. The method of claim 20 wherein $R^2$ is $(CH_2)_n$, wherein n=1-5.

22. The method of claim 16 wherein the metal-containing layer is a metal oxide layer.

23. The method of claim 16 wherein the metal-containing layer is a dielectric layer.

24. The method of claim 16 wherein the metal-containing layer has a thickness of about 10 Å to about 100 Å.

25. The method of claim 16 wherein the temperature of the semiconductor substrate or substrate assembly is about 25° C. to about 400° C.

26. The method of claim 16 wherein the atomic layer deposition chamber containing the semiconductor substrate or substrate assembly has a pressure of about $10^{-4}$ torr to about 10 torr.

27. The method of claim 16 further comprising purging excess vapor comprising the at least one precursor compound of Formula I from the deposition chamber after chemisorption of the compound onto the semiconductor substrate or substrate assembly.

28. The method of claim 27 wherein purging comprises purging with an inert gas.

29. The method of claim 28 wherein the inert gas is selected from the group consisting of nitrogen, helium, argon, and mixtures thereof.

30. The method of claim 16 further comprising providing a vapor comprising at least one metal-containing precursor compound that is different than the precursor compound of Formula I and directing this vapor to the semiconductor substrate or substrate assembly to allow the at least one metal-containing compound to chemisorb on the at least one surface of the semiconductor substrate or substrate assembly.

31. A method of manufacturing a semiconductor structure, the method comprising:
providing a semiconductor substrate or substrate assembly;
providing a vapor comprising at least one precursor compound of the formula $M(OR^1)_{5-x}(XR^2O)_x$ (Formula I), wherein:
M is selected from the group consisting of niobium and vanadium,
X is $(NR^3R^4)$, $(PR^3R^4)$, or $(OR^5)$,
each $R^1$, $R^2$, $R^3$, $R^4$, and $R^5$ is independently an organic group,
x=1 or 2;
providing a vapor comprising at least one metal-containing precursor compound different than $M(OR^1)_{5-x}(XR^2O)_x$ (Formula I);
directing the vapor comprising the at least one precursor compound of Formula I and the vapor comprising the at least one metal-containing precursor compound different that the precursor compound of Formula I to the semiconductor substrate or substrate assembly to form a metal-containing layer on at least one surface of the semiconductor substrate or substrate assembly using an atomic layer deposition process comprising a plurality of deposition cycles.

32. The method of claim 31 wherein $R^1$, $R^2$, $R^3$, $R^4$, and $R^5$ are each independently organic groups having 1-10 carbon atoms.

33. The method of claim 32 wherein $R^2$ is $(CH_2)_n$, wherein n=1-5.

34. The method of claim 31 wherein the vapor comprising the at least one precursor compound of Formula I and the vapor comprising the at least one metal-containing precursor compound different that the precursor compound of Formula I are directed to the semiconductor substrate or substrate assembly substantially simultaneously.

35. The method of claim 31 wherein the metal-containing layer is a metal oxide layer.

36. The method of claim 31 wherein the metal-containing layer is a dielectric layer.

37. The method of claim 31 further comprising at least one reaction gas.

38. The method of claim 37 wherein the at least one reaction gas is selected from the group consisting of oxygen, water vapor, ozone, nitrogen oxides, sulfur oxides, hydrogen, hydrogen sulfide, hydrogen selenide, hydrogen telluride, hydrogen peroxide, ammonia, organic amine, silane, disilane, higher silanes, diborane, plasma, air, and combinations thereof.

39. The method of claim 38 wherein the at least one reaction gas is selected from the group consisting of ozone and oxygen.

40. The method of claim 37 wherein the vapor comprising the at least one precursor compound of Formula I and the vapor comprising the at least one metal-containing precursor compound different that the precursor compound of Formula I are directed to the semiconductor substrate or substrate assembly prior to directing the at least one reaction gas to the semiconductor substrate or substrate assembly.

41. The method of claim 31 wherein the vapor comprising the at least one precursor compound of Formula I and the vapor comprising the at least one metal-containing precursor compound different that the precursor compound of Formula I further comprise a nonreactive gas.

42. The method of claim 41 wherein the nonreactive gas is selected from the group consisting of nitrogen, helium, argon, and mixtures thereof.

43. The method of claim 31 wherein the metal-containing precursor compound different than Formula I comprises at least one metal selected from the group consisting of bismuth, tantalum, hafnium, aluminum, niobium, vanadium, and combinations thereof.

44. A method of forming a niobium oxide layer on a substrate, the method comprising:
providing a substrate;
providing a vapor comprising at least one precursor compound of the formula $M(OR^1)_{5-x}(XR^2O)_x$ (Formula I), wherein:
M is niobium,
X is $(NR^3R^4)$, $(PR^3R^4)$, or $(OR^5)$,
each $R^1$, $R^2$, $R^3$, $R^4$, and $R^5$ is independently an organic group,
x=1 or 2; and
contacting the vapor comprising the at least one precursor compound with the substrate to form a niobium oxide layer on at least one surface of the substrate using an atomic layer deposition process comprising a plurality of deposition cycles.

45. The method of claim 44 wherein $R^1$, $R^2$, $R^3$, $R^4$, and $R^5$ are each independently organic groups having 1-10 carbon atoms.

46. The method of claim 45 wherein $R^2$ is $(CH_2)_n$, wherein n=1-5.

47. The method of claim 44 wherein the substrate comprises silicon, borophosphosilicate glass (BPSG), tetraethylorthosilicate (TEOS) oxide, spin on glass, TiN, TaN, W, noble metals, or combinations thereof.

48. The method of claim 44 wherein the metal-containing layer is a dielectric layer.

49. The method of claim 44 wherein the formed niobium oxide layer has a thickness of about 10 Å to about 100 Å.

50. A method of forming a niobium oxide layer on a substrate, the method comprising:
providing a substrate;
providing a vapor comprising at least one precursor compound of the formula $M(OR^1)_{5-x}(XR^2O)_x$ (Formula I), wherein:
M is niobium,
X is $(NR^3R^4)$, $(PR^3R^4)$, or $(OR^5)$,
each $R^1$, $R^2$, $R^3$, $R^4$, and $R^5$ is independently an organic group,
x=1 or 2;
providing at least one reaction gas; and
contacting the vapor comprising the at least one precursor compound with the substrate to form a niobium oxide layer on at least one surface of the substrate using an atomic layer deposition process comprising a plurality of deposition cycles.

51. The method of claim 50 wherein $R^1$, $R^2$, $R^3$, $R^4$, and $R^5$ are each independently organic groups having 1-10 carbon atoms.

52. The method of claim 51 wherein $R^2$ is $(CH_2)_n$, wherein n=1-5.

53. The method of claim 50 wherein the metal-containing layer is a dielectric layer.

54. The method of claim 50 wherein the at least one reaction gas is selected from the group consisting of oxygen, water vapor, ozone, nitrogen oxides, sulfur oxides, hydrogen, hydrogen sulfide, hydrogen selenide, hydrogen telluride, hydrogen peroxide, ammonia, organic amine, silane, disilane, higher silanes, diborane, plasma, air, and combinations thereof.

55. The method of claim 54 wherein the at least one reaction gas is selected from the group consisting of ozone and oxygen.

56. The method of claim 50 wherein during the atomic layer deposition process, the niobium oxide layer is formed by alternately introducing the vapor comprising the at least one precursor compound and the at least one reaction gas during each deposition cycle.

57. A method of forming a niobium oxide layer on a substrate, the method comprising:
providing a substrate within a deposition chamber;
providing a vapor comprising at least one precursor compound of the formula $M(OR^1)_{5-x}(XR^2O)_x$ (Formula I), wherein:
M is niobium,
X is $(NR^3R^4)$, $(PR^3R^{4), \text{ or } (OR5)})$,
each $R^1$, $R^2$, $R^3$, $R^4$, and $R^5$ is independently an organic group,
x=1 or 2;
directing the vapor comprising the at least one precursor compound of Formula I to the substrate and allowing the at least one compound to chemisorb to at least one surface of the substrate;
providing at least one reaction gas; and
directing the at least one reaction gas to the substrate with the chemisorbed species thereon to form a niobium oxide layer on at least one surface of the substrate.

58. The method of claim 57 wherein the at least one reaction gas is selected from the group consisting of oxygen, water vapor, ozone, nitrogen oxides, sulfur oxides, hydrogen, hydrogen sulfide, hydrogen selenide, hydrogen telluride, hydrogen peroxide, ammonia, organic amine, silane, disilane, higher silanes, diborane, plasma, air, and combinations thereof.

59. The method of claim 58 wherein the at least one reaction gas is selected from the group consisting of ozone and oxygen.

60. The method of claim 57 wherein providing a vapor comprising at least one precursor compound of Formula I, directing the vapor to the substrate, providing at least one reaction gas, and directing the at least one reaction gas to the substrate is repeated at least once.

61. The method of claim 57 wherein $R^1$, $R^2$, $R^3$, $R^4$, and $R^5$ are each independently organic groups having 1-10 carbon atoms.

62. The method of claim 61 wherein $R^2$ is $(CH_2)_n$, wherein n=1-5.

63. The method of claim 57 wherein the metal-containing layer has a thickness of about 10 Å to about 100 Å.

64. The method of claim 57 wherein the temperature of the substrate is about 25° C. to about 400° C.

65. The method of claim 57 wherein the atomic layer deposition chamber containing the substrate has a pressure of about $10^{-4}$ torr to about 10 torr.

66. The method of claim 57 further comprising providing a vapor comprising at least one metal-containing precursor compound that is different than the precursor compound of Formula I and directing this vapor to the substrate to allow the at least one metal-containing compound to chemisorb on the at least one surface of the substrate.

67. A method of forming a niobium oxide layer on a substrate, the method comprising:
providing a substrate;
providing a vapor comprising at least one precursor compound of the formula $M(OR^1)_{5-x}(XR^2O)_x$ (Formula I), wherein:
M is niobium,
X is $(NR^3R^4)$, $(PR^3R^4)$, or $(OR^5)$,
each $R^1$, $R^2$, $R^3$, $R^4$, and $R^5$ is independently an organic group,
x=1 or 2;
providing a vapor comprising at least one metal-containing precursor compound different than $M(OR^1)_{5-x}(XR^2O)_x$ (Formula I);
directing the vapor comprising the at least one precursor compound of Formula I and the vapor comprising the at least one metal-containing precursor compound different that the precursor compound of Formula I to the substrate to form a layer comprising niobium oxide on at least one surface of the substrate using an atomic layer deposition process comprising a plurality of deposition cycles.

68. The method of claim 67 wherein $R^1$, $R^2$, $R^3$, $R^4$, and $R^5$ are each independently organic groups having 1-10 carbon atoms.

69. The method of claim 68 wherein $R^2$ is $(CH_2)_n$, wherein n=1-5.

70. The method of claim 67 wherein the vapor comprising the at least one precursor compound of Formula I and the vapor comprising the at least one metal-containing precursor compound different that the precursor compound of Formula I are directed to the substrate substantially simultaneously.

71. The method of claim 67 wherein the metal-containing layer is a dielectric layer.

72. The method of claim 67 further comprising at least one reaction gas.

73. The method of claim 72 wherein the at least one reaction gas is selected from the group consisting of oxygen, water vapor, ozone, nitrogen oxides, sulfur oxides, hydrogen, hydrogen sulfide, hydrogen selenide, hydrogen telluride, hydrogen peroxide, ammonia, organic amine, silane, disilane, higher silanes, diborane, plasma, air, and combinations thereof.

74. The method of claim 73 wherein the at least one reaction gas selected from the group consisting of ozone and oxygen.

75. The method of claim 67 wherein the vapor comprising the at least one precursor compound of Formula I and the vapor comprising the at least one metal-containing precursor compound different that the precursor compound of Formula I are directed to the substrate prior to directing at least one reaction gas to the substrate.

76. The method of claim 67 wherein the vapor comprising the at least one precursor compound of Formula I and the vapor comprising the at least one metal-containing precursor compound different that the precursor compound of Formula I further comprise a nonreactive gas.

77. The method of claim 76 wherein the nonreactive gas is selected from the group consisting of nitrogen, helium, argon, and mixtures thereof.

78. The method of claim 67 wherein the metal-containing precursor compound different than Formula I comprises at least one metal selected from the group consisting of bismuth, tantalum, hafnium, aluminum, niobium, vanadium, and combinations thereof.

79. A method of manufacturing a memory device structure, the method comprising:
providing a substrate having a first electrode thereon;
providing at least one precursor compound of the formula $M(OR^1)_{5-x}(XR^2O)_x$ (Formula I), wherein:
M is selected from the group consisting of niobium and vanadium,
X is $(NR^3R^4)$, $(PR^3R^4)$, or $(OR^5)$, each $R^1$, $R^2$, $R^3$, $R^4$, and $R^5$ is independently an organic group, x=1 or 2;

vaporizing the at least one precursor compound of Formula I;

contacting the at least one vaporized precursor compound of Formula I with the substrate to chemisorb the compound on the first electrode of the substrate;

providing at least one reaction gas;

contacting the at least one reaction gas with the substrate with the chemisorbed compound thereon to form a dielectric layer on the first electrode of the substrate; and forming a second electrode on the dielectric layer.

80. The method of claim 79 wherein $R^1$, $R^2$, $R^3$, $R^4$, and $R^5$ are each independently organic groups having 1-10 carbon atoms.

81. The method of claim 80 wherein $R^2$ is $(CH_2)_n$, wherein n=1-5.

82. The method of claim 79 wherein the at least one reaction gas is selected from the group consisting of oxygen, water vapor, ozone, nitrogen oxides, sulfur oxides, hydrogen, hydrogen sulfide, hydrogen selenide, hydrogen telluride, hydrogen peroxide, ammonia, organic amine, silane, disilane, higher silanes, diborane, plasma, air, and combinations thereof.

83. The method of claim 82 wherein the at least one reaction gas is selected from the group consisting of ozone and oxygen.

84. The method of claim 79 wherein the vapor comprising the at least one precursor compound of Formula I further comprises a nonreactive gas.

85. The method of claim 84 wherein the nonreactive gas is selected from the group consisting of nitrogen, helium, argon, and mixtures thereof.

* * * * *

UNITED STATES PATENT AND TRADEMARK OFFICE
CERTIFICATE OF CORRECTION

PATENT NO. : 7,482,037 B2
APPLICATION NO. : 10/923315
DATED : January 27, 2009
INVENTOR(S) : Garo J. Derderian et al.

It is certified that error appears in the above-identified patent and that said Letters Patent is hereby corrected as shown below:

In column 15, line 50, in Claim 13, delete "thereof" and insert -- thereof. --, therefor.

In column 17, line 20, in Claim 31, delete "Ito" and insert -- I to --, therefor.

In column 19, line 16, in Claim 57, delete "$(PR^3R^{4), \ or \ (OR5})$," and insert -- $(PR^3R^4)$, or $(OR^5)$, --, therefor.

In column 20, line 11, in Claim 67, delete "Ito" and insert -- I to --, therefor.

Signed and Sealed this

Twenty-eighth Day of April, 2009

JOHN DOLL
*Acting Director of the United States Patent and Trademark Office*